(12) United States Patent
Uematsu

(10) Patent No.: US 8,082,118 B2
(45) Date of Patent: Dec. 20, 2011

(54) TEST APPARATUS

(75) Inventor: Tomohiro Uematsu, Gunma (JP)

(73) Assignee: Advantest Corporation, Tokyo (JP)

( * ) Notice: Subject to any disclaimer, the term of this patent is extended or adjusted under 35 U.S.C. 154(b) by 63 days.

(21) Appl. No.: 12/603,331

(22) Filed: Oct. 21, 2009

(65) Prior Publication Data

US 2010/0312507 A1    Dec. 9, 2010

Related U.S. Application Data

(63) Continuation of application No. PCT/JP2007/058985, filed on Apr. 25, 2007.

(51) Int. Cl.
*G01R 25/00* (2006.01)
(52) U.S. Cl. ........................................ 702/79
(58) Field of Classification Search ............... 702/79
See application file for complete search history.

(56) References Cited

U.S. PATENT DOCUMENTS

| 7,549,099 | B2  | 6/2009 | Kantake |         |
|-----------|-----|--------|---------|---------|
| 2007/0006031 | A1 | 1/2007 | Kantake |         |
| 2007/0061094 | A1* | 3/2007 | Ochi et al. | 702/108 |
| 2008/0018345 | A1* | 1/2008 | Chiba et al. | 324/617 |

FOREIGN PATENT DOCUMENTS

| JP | 2005-285160 A | 10/2005 |
| JP | 2006-337099 A | 12/2006 |
| JP | 2007-017257 A | 1/2007 |

OTHER PUBLICATIONS

International Search Report (ISR) for PCT/JP2007/058985 for Examiner consideration, citing Foreign Patent Document Nos. 1-2 listed above.
Written Option (PCT/ISA/237) of PCT/JP2007/058985.

* cited by examiner

*Primary Examiner* — Aditya Bhat
(74) *Attorney, Agent, or Firm* — Chen Yoshimura LLP

(57) ABSTRACT

Provided is a test apparatus that tests a device under test, comprising a clock recovering section that recovers a clock signal from an output signal output by the device under test; an acquiring section that acquires the output signal at a timing corresponding to the clock signal; an adjusting section that adjusts a phase difference between the clock signal and the output signal received by the acquiring section, according to an adjustment amount supplied thereto; a setting memory that stores an adjustment amount of the phase difference between the clock signal and the output signal in the acquiring section in association with each of a plurality of test conditions; and a setting section that supplies the adjusting section with an adjustment amount associated with a test condition for testing the device under test, based on the adjustment amounts stored in the setting memory.

5 Claims, 6 Drawing Sheets

| FREQUENCY | LEVEL | ADJUSTMENT AMOUNT |
|---|---|---|
| A (Hz) | a (V) | X X X  Sec |
| A (Hz) | b (V) | X X X  Sec |
| A (Hz) | c (V) | X X X  Sec |
| B (Hz) | a (V) | X X X  Sec |
| B (Hz) | b (V) | X X X  Sec |
| B (Hz) | c (V) | X X X  Sec |
| C (Hz) | a (V) | X X X  Sec |
| C (Hz) | b (V) | X X X  Sec |
| C (Hz) | c (V) | X X X  Sec |
| ⋮ | ⋮ | ⋮ |

*FIG. 3*

TEST APPARATUS

BACKGROUND

1. Technical Field

The present invention relates to a test apparatus. In particular, the present invention relates to a test apparatus that recovers a clock signal from an output signal of a device under test.

2. Related Art

A test apparatus that tests a device under test including a high-speed serial interface that buries a clock signal is known, as in, for example, Patent Documents 1 and 2. Each of these test apparatuses uses a PLL to recover a clock signal from an output signal of a device under test, and acquires the logic value of the output signal with a timing comparator at a timing based on the recovered clock signal.

Patent Document 1: Japanese Patent Application Publication No. 2005-285160

Patent Document 2: Japanese Patent Application Publication No. 2007-017257

The path on which the output signal and the clock signal are transmitted changes the signal delay time according to the frequency and level of the output signal and the clock signal. Therefore, when the type of device under test is changed, the level and frequency of the output signal change as well, which causes a phase difference between the clock signal and the output signal input to the timing comparator.

When there is a phase difference between the output signal and the clock signal, the timing at which the timing comparator acquires the output signal changes. When the acquisition timing of the output signal changes, an error arises in the acquired results. Accordingly, when the frequency and the level of the output signal change, the test apparatus cannot perform accurate testing.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to an aspect relating to the innovations herein, provided is a test apparatus that tests a device under test, comprising a clock recovering section that recovers a clock signal from an output signal output by the device under test; an acquiring section that acquires the output signal at a timing corresponding to the clock signal; an adjusting section that adjusts a phase difference between the clock signal and the output signal received by the acquiring section, according to an adjustment amount supplied thereto; a setting memory that stores an adjustment amount of the phase difference between the clock signal and the output signal in the acquiring section in association with each of a plurality of test conditions; and a setting section that supplies the adjusting section with an adjustment amount associated with a test condition for testing the device under test, based on the adjustment amounts stored in the setting memory.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows exemplary adjustment amounts stored in the setting memory 34 according to the present embodiment.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
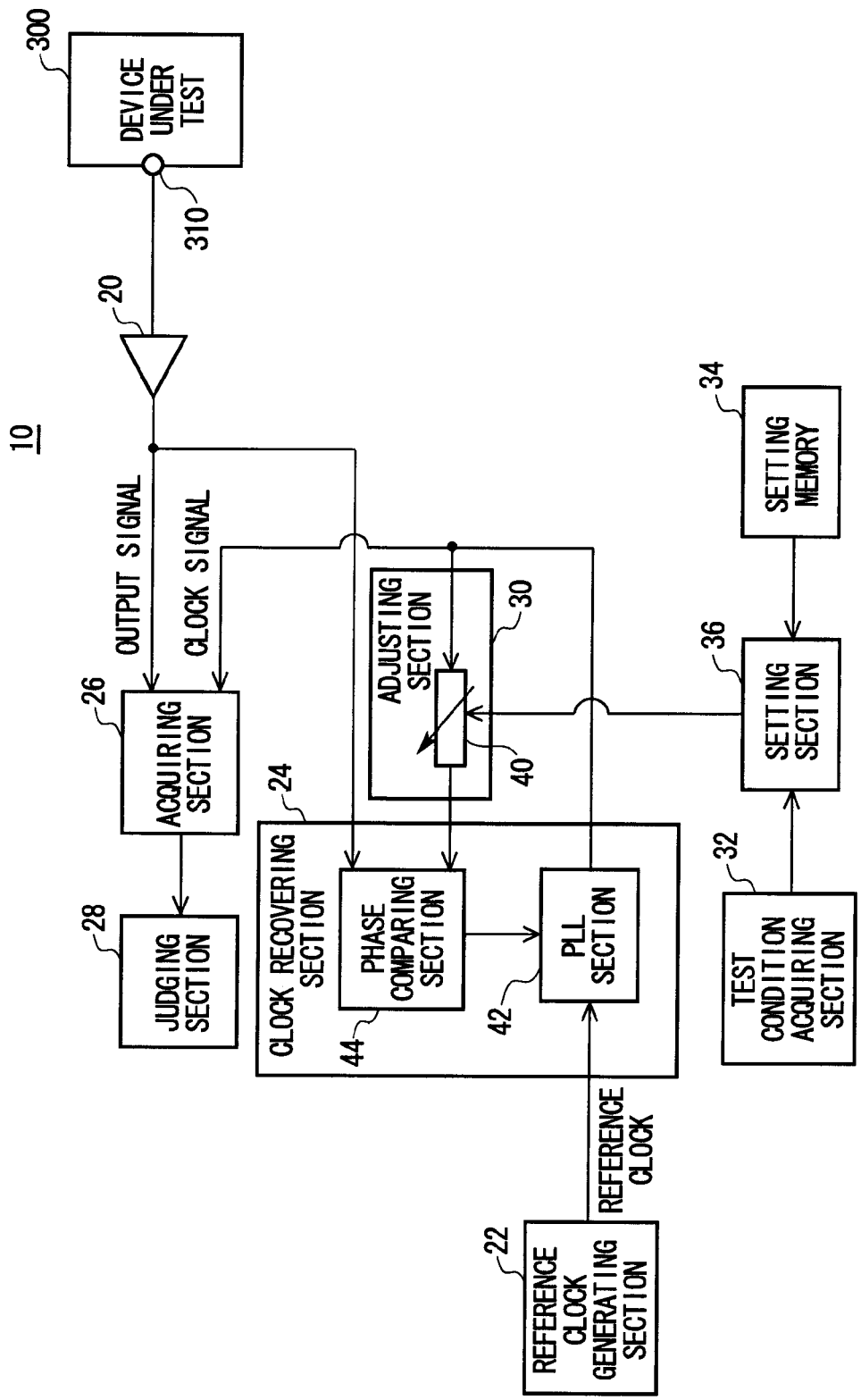
FIG. 1 shows a configuration of a test apparatus 10 according to an embodiment of the present invention, along with a device under test 300.

FIG. 1 shows a configuration of a test apparatus 10 according to an embodiment of the present invention, along with a device under test 300. The test apparatus 10 tests the device under test 300. More specifically, the test apparatus 10 recovers a clock signal from the output signal of the device under test 300 and acquires a logic value of the output signal at a timing of the recovered clock signal. The test apparatus 10 compares the acquired logic value of the output signal to the logic value of an expected signal, and judges acceptability of the device under test 300 based on the comparison result.

The test apparatus 10 includes a level comparing section 20, a reference clock generating section 22, a clock recovering section 24, an acquiring section 26, a judging section 28, an adjusting section 30, a test condition acquiring section 32, a setting memory 34, and a setting section 36. The level comparing section 20 receives a data signal in which is buried a clock and that is output from the data output terminal 310 of the device under test 300. The level comparing section 20 binarizes the received data signal using a predetermined threshold level. The level comparing section 20 outputs, as the output signal, a signal obtained by binarizing the data signal.

The reference clock generating section 22 generates the reference clock of the test apparatus 10. The clock recovering section 24 receives the output signal from the level comparing section 20 and recovers the clock signal from the received output signal. For example, the clock recovering section 24 may output a clock signal having a frequency that is an integer multiple of the reference clock.

The acquiring section 26 receives the output signal from the level comparing section 20, and also receives, as a strobe signal, a clock signal obtained by the adjusting section 30 performing a prescribed phase adjustment on the clock signal recovered by the clock recovering section 24. The acquiring section 26 acquires a determined output signal whose timing is determined by the clock signal. The acquiring section 26 may be a timing comparator that acquires the logic value of the output signal, i.e. logic H or logic L, at a timing of an edge of the clock signal.

The judging section 28 compares the logic value of the determined output signal from the acquiring section 26 to the logic value of an expected signal. The judging section 28 judges acceptability of the device under test 300 based on the comparison result.

The adjusting section 30 is inserted serially into the PLL loop path formed with the clock recovering section 24, and can set the clock signal to have a prescribed phase based on settings from the setting section 36. The adjusting section 30 adjusts the phase difference between the clock signal and the output signal received by the acquiring section 26 according to an adjustment amount supplied thereto. The adjusting section 30 adjusts the phase difference between the clock signal and the output signal received by the acquiring section 26 to be a predetermined phase difference, according to the adjustment amount supplied thereto.

In the present embodiment, the adjusting section 30 includes a delay element 40. The delay element 40 delays the clock signal recovered by the clock recovering section 24 by the supplied adjustment amount, which in this case is a delay amount, and feeds the delayed clock signal back to the clock recovering section 24. In this case, the clock recovering section 24 controls the phase of the output clock signal such that the phase of the output signal from the level comparing section 20 matches the phase of the clock signal delayed by the delay element 40. In this way, the adjusting section 30 can adjust the phase difference between the clock signal and the output signal received by the acquiring section 26 to be a phase difference corresponding to the supplied adjustment amount, i.e. delay amount.

Instead of this delay element 40, the adjusting section 30 may include a delay element that delays the clock signal recovered by the clock recovering section 24 by a supplied delay amount and output the delayed clock signal to the acquiring section 26. In this case, the clock recovering section 24 controls the phase of the output clock signal such that the phase of the output signal from the level comparing section 20 matches the phase of the clock signal prior to being input to the delay element.

The test condition acquiring section 32 acquires a test condition for testing the device under test 300 from an external controller, setting register, or the like. For example, the test condition acquiring section 32 may acquire, as the test condition, at least one of a clock frequency and a level of the output signal. Instead of or in addition to these conditions, the test condition acquiring section 32 may acquire, as the test condition, a temperature of the test apparatus 10, an expected value pattern of the output signal, or the like.

The setting memory 34 stores the adjustment amount of the phase difference between the clock signal and the output signal, in association with each of a plurality of test conditions. For example, the setting memory 34 may store an adjustment amount in association with each value of at least one of the clock frequency and the level of the output signal. Instead of or in addition to this, the setting memory 34 may store an adjustment amount in association with a temperature of the test apparatus 10, an expected value pattern of the output signal, or the like. In the present embodiment, the setting memory 34 stores a delay amount of the delay element 40 as the adjustment amount.

Here, the setting memory 34 stores an adjustment amount that is calculated prior to testing of the device under test 300. For example, the setting memory 34 may store an adjustment amount that is calculated based on a value measured during calibration.

The setting section 36 supplies the adjusting section 30 with the adjustment amount corresponding to the test condition for testing the device under test 300, based on adjustment amounts stored in the setting memory 34. For example, the setting section 36 selects, from the setting memory 34, the adjustment amount that is associated with the test condition acquired by the test condition acquiring section 32, and supplies the adjusting section 30 with the selected adjustment amount. As another example, the setting section 36 may calculate the adjustment amount associated with the test condition for testing the device under test 300 by performing an interpolation based on adjustment amounts stored in the setting memory 34, and may supply the adjusting section 30 with the calculated adjustment amount. In this way, the setting section 36 can decrease the number of adjustment amounts that are stored in advance in the setting memory 34.

Figure 2:
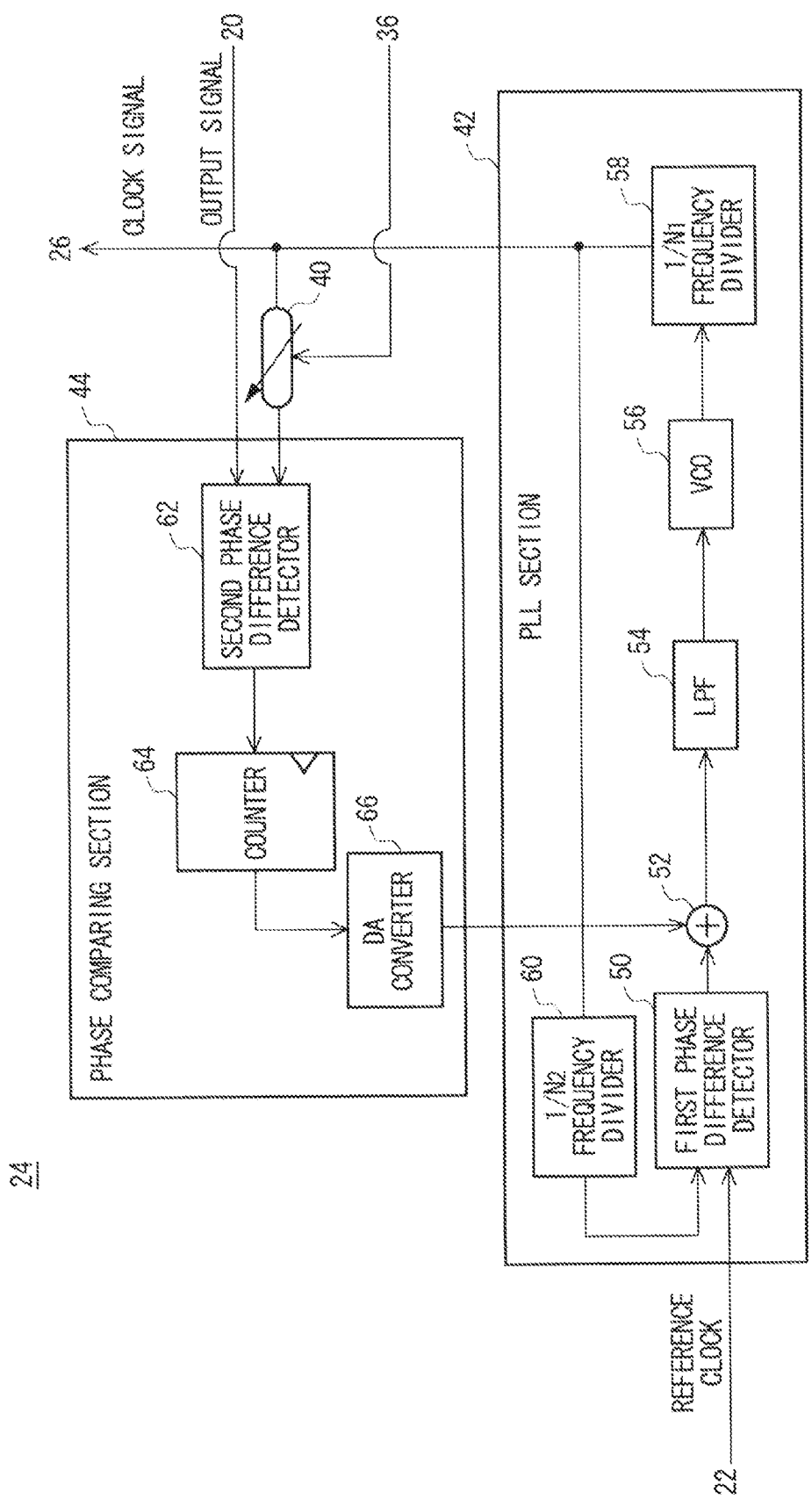
FIG. 2 shows an exemplary configuration of the clock recovering section 24 according to the present embodiment, along with the delay element 40 included in the adjusting section 30.

FIG. 2 shows an exemplary configuration of the clock recovering section 24 according to the present embodiment, along with the delay element 40 included in the adjusting section 30. The clock recovering section 24 may include a PLL section 42 and a phase comparing section 44.

The PLL section 42 includes a first phase detector 50, an adder 52, a LPF 54, a VCO 56, a $1/N_1$ frequency divider 58, and a $1/N_2$ frequency divider 60. The first phase detector 50 detects a phase difference between the reference clock and the output signal from the $1/N_2$ frequency divider 60, and outputs a signal having a duty ratio corresponding to the detected phase difference.

The adder 52 adds the voltage output from the phase comparing section 44 to the output voltage of the first phase detector 50. The LPF 54 outputs a control voltage obtained by smoothing the voltage output by the adder 52. The VCO 56 outputs a signal having a frequency that corresponds to the control voltage output by the LPF 54.

The $1/N_1$ frequency divider 58 frequency divides the signal output from the VCO 56 by $1/N_1$, where $N_1$ is a positive integer, for example. The $1/N_2$ frequency divider 60 frequency divides the signal output from the $1/N_1$ frequency divider 58 by $1/N_2$, where $N_2$ is a positive integer, for example.

The PLL section 42 described above outputs, as the clock signal, the signal output from the $1/N_1$ frequency divider 58. The PLL section 42 can output a clock signal having a frequency that is $N_2$ times the frequency of the reference clock and having a phase that is shifted relative to the reference clock by an amount corresponding to the voltage value output by the phase comparing section 44.

The phase comparing section 44 includes a second phase detector 62, a counter 64, and a DA converter 66. The second phase detector 62 detects the phase difference between the clock signal delayed by the delay element 40 and the output signal from the level comparing section 20, and outputs a signal having a duty ratio corresponding to the detected phase difference.

The counter 64 performs a down-count or an up-count according to the output signal from the second phase detector 62. For example, the counter 64 performs an up-count when the output signal from the second phase detector 62 is a high level, and performs a down-count when the output signal from the second phase detector 62 is a low level. In this way, the counter 64 can output a digital value corresponding to the phase difference between the output signal and the clock signal delayed by the delay element 40.

The DA converter 66 outputs a voltage with a value corresponding to the count value of the counter 64. In this way, the phase comparing section 44 can output a voltage corresponding to the phase difference between the output signal and the clock signal delayed by the delay element 40.

The clock recovering section 24 described above can output a clock signal that has (i) a frequency in synchronization with the output signal received by the phase comparing section 44 and (ii) a phase that is shifted from the output signal received by the phase comparing section 44 by the delay amount of the delay element 40. In other words, the clock recovering section 24 can output a clock signal having a frequency synchronized with the output signal and a phase shifted from the output signal by the delay amount of the delay element 40. In this way, the clock recovering section 24 can adjust the phase difference between the clock signal and the output signal received by the acquiring section 26 to be a phase difference corresponding to the adjustment amount supplied from the setting section 36.

FIG. 3 shows exemplary adjustment amounts stored in the setting memory 34 according to the present embodiment. In the present embodiment, the setting memory 34 stores an adjustment amount for each combination of frequency and level of the output signal of the device under test 300, as shown in FIG. 3. In the present embodiment, the setting memory 34 stores delay times of the delay element 40 as the adjustment amounts. Instead of or in addition to this, the setting memory 34 may store an adjustment amount for each combination including temperature of the test apparatus 10, the expected value pattern of the output signal, or the like.

Here, each adjustment amount stored in the setting memory 34 is a value for obtaining a predetermined phase difference between the clock signal and the output signal received by the acquiring section 26 when the device under test 300 is tested according to a corresponding test condition. In the present embodiment, each adjustment amount stored in the setting memory 34 is a value for obtaining a predetermined phase difference between the clock signal and the output signal received by the acquiring section 26 when the output signal of the device under test 300 has a corresponding frequency and level.

In this way, even if the test condition changes, the acquiring section 26 can acquire the logic value of the output signal with the phase difference between the clock signal and the output signal being adjusted to the predetermined phase difference. In the present example, even if the level and the frequency of the output signal change, the acquiring section 26 can acquire the logic value of the output signal with the phase difference between the clock signal and the output signal being adjusted to the predetermined phase difference.

Figure 4:
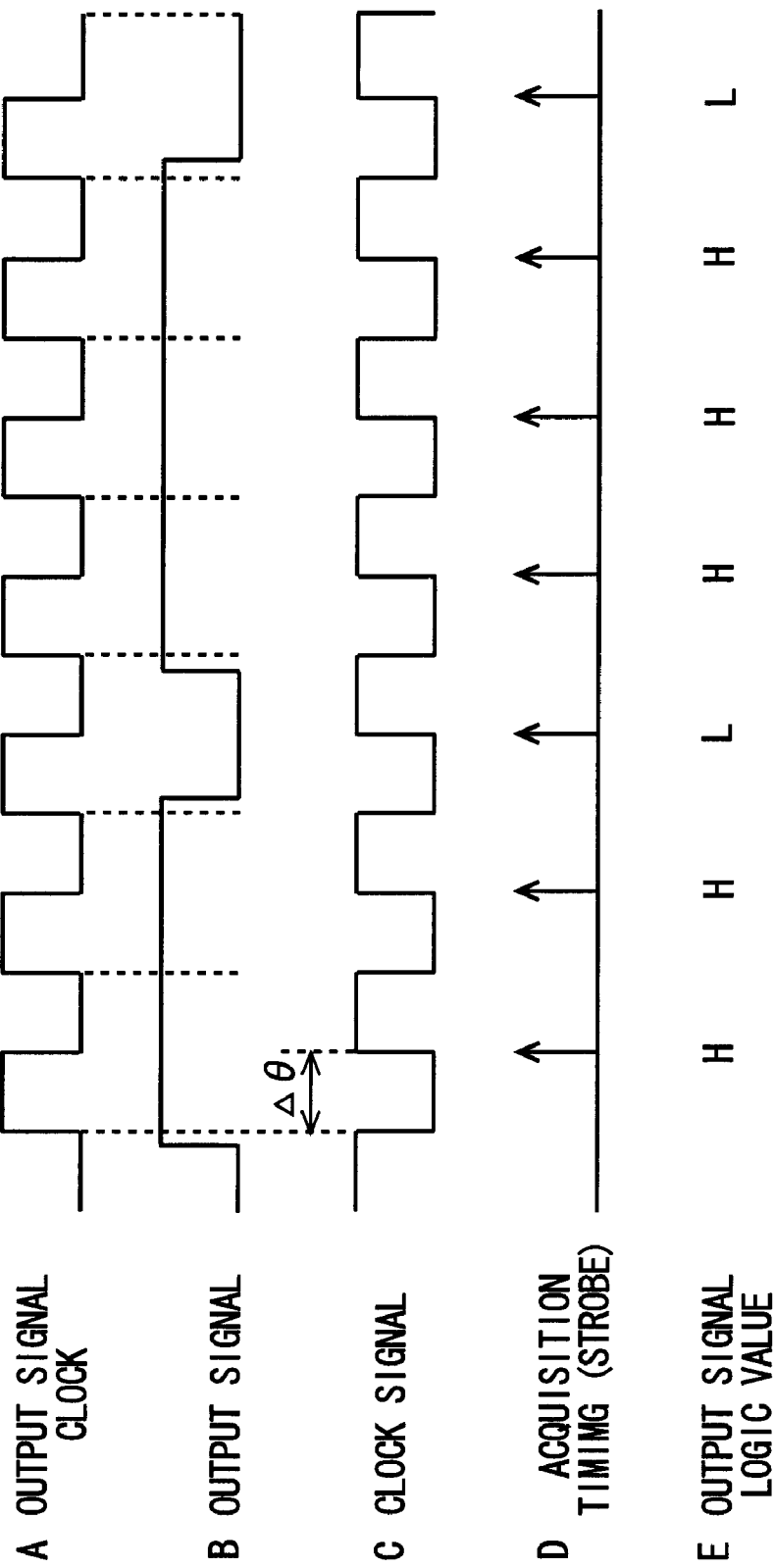
FIG. 4 shows examples of the signals transmitted in the test apparatus 10 of the present embodiment.

FIG. 4 shows examples of the signals transmitted in the test apparatus 10 of the present embodiment. In FIG. 4, A shows the clock of the output signal received by the acquiring section 26, B shows the output signal received by the acquiring section 26, C shows the clock signal recovered by the clock recovering section 24, D shows the acquisition timing (strobe timing) of the logic value of the output signal by the acquiring section 26, and E shows the logic value of the output signal acquired by the acquiring section 26 at the strobe timing D.

As a result of the adjustment of the phase difference between the clock signal and the output signal by the adjusting section 30, the acquiring section 26 receives the clock signal and the output signal having the prescribed phase difference $\Delta\theta$ therebetween. For example, the acquiring section 26 receives the clock signal and the output signal having a phase difference of 180 degrees therebetween.

The acquiring section 26 acquires the output signal at the strobe timing generated based on the clock signal. For example, the acquiring section 26 may acquire the output signal at a strobe timing synchronized with a rising edge of the clock signal. In this way, the acquiring section 26 can acquire the logic value of the output signal at a central phase in each cycle of the output signal. Accordingly, the acquiring section 26 can accurately acquire the logic value of the output signal with a large phase margin between adjacent symbols.

Here, if the adjustment amount supplied to the adjusting section 30 is fixed, the phase difference between the clock signal and the output signal received by the acquiring section 26 changes according to a change in the test condition. However, the setting section 36 may select from the setting memory 34, for each test, an adjustment amount corresponding to the test condition acquired by the test condition acquiring section 32, and supply the adjusting section 30 with the selected adjustment amount. In this way, when the test condition changes, the setting section 36 can set the phase difference between the clock signal and the output signal received by the acquiring section 26 to be the predetermined phase difference. For example, even if the test condition changes, the setting section 36 can cause the phase difference between the clock signal and the output signal received by the acquiring section 26 to be 180 degrees.

As described above, even if the test condition, such as the level and frequency of the output signal, changes, the test apparatus 10 can maintain a constant phase for acquiring the output signal. As a result, the test apparatus 10 can decrease the error in the acquisition result of the output signal to perform more accurate testing.

Figure 5:
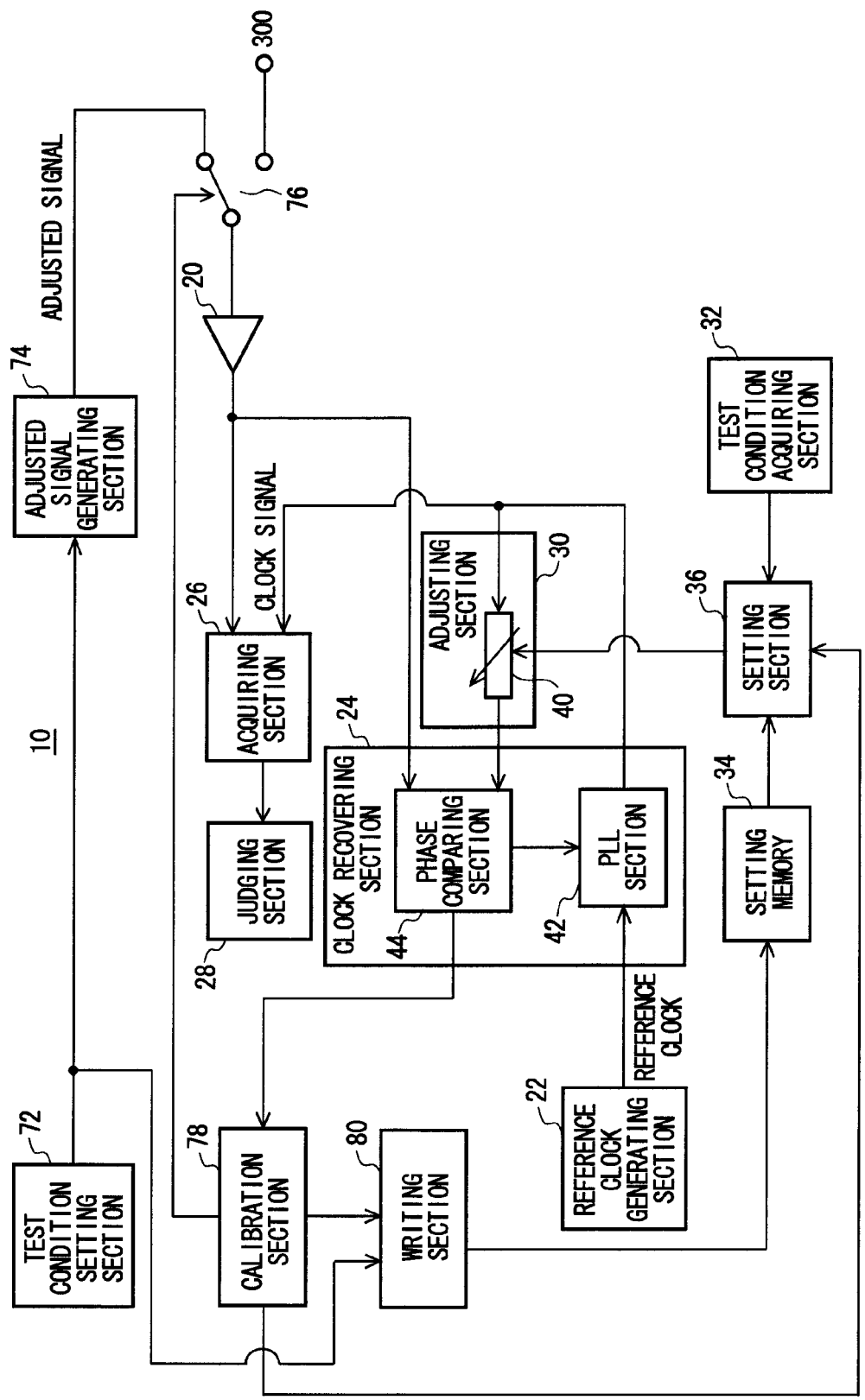
FIG. 5 shows a configuration of the test apparatus 10 according to a first modification of the present embodiment.

FIG. 5 shows a configuration of the test apparatus 10 according to a first modification of the present embodiment. The components of the test apparatus 10 of the present modification adopt the same function and configuration as the components having the same reference numerals in FIG. 1, and therefore the following description includes only differing points.

The test apparatus 10 further includes a test condition setting section 72, an adjusted signal generating section 74, a switching section 76, a calibration section 78, and a writing section 80. Prior to testing the device under test 300 or during a test sequence, the test apparatus 10 performs a calibration to calculate adjustment amounts corresponding to a plurality of test conditions.

The test condition setting section 72 sets a test condition. For example, the test condition setting section 72 sets at least one of a level and a frequency of the output signal as the test condition. Instead of or in addition to this, the test condition setting section 72 may set a temperature of the test apparatus 10, an expected value pattern of the output signal, or the like as the test condition.

The adjusted signal generating section 74 generates an adjusted signal corresponding to the test condition set by the test condition setting section 72. For example, the adjusted signal generating section 74 may generate an adjusted signal having a level and frequency set by the test condition setting section 72.

The switching section 76 supplies the level comparing section 20 with either the data signal output by the device under test 300 or the adjusted signal output by the adjusted signal generating section 74. During calibration, the switching section 76 supplies the level comparing section 20 with the adjusted signal output from the adjusted signal generating section 74 instead of the data signal output from the device under test 300.

If the level comparing section 20 receives the adjusted signal instead of the data signal, the test apparatus 10 may include a substrate having wiring that transmits signals from the adjusted signal generating section 74 to the level comparing section 20, in place of the substrate on which the device under test 300 is loaded. Instead, if the adjusted signal generating section 74 includes a DC characteristic measuring section and switching relay, not shown, for measuring the DC characteristic of the device under test 300 during testing, the test apparatus 10 may have a configuration in which the adjusted signal generated by the adjusted signal generating section 74 is supplied via the switching relay.

The calibration section 78 performs control for supplying the clock recovering section 24 and the acquiring section 26 with the adjusted signal instead of the output signal during calibration. More specifically, after controlling the switching of the switching section 76 to allow the acquiring section 26 to receive the adjusted signal output from the adjusted signal generating section 74, the calibration section 78 causes the adjusted signal generating section 74 to generate the adjusted signal.

The calibration section 78 detects the adjustment amount that causes the phase difference between the clock signal and the adjusted signal in the acquiring section 26 to have a prescribed value. For example, the calibration section 78 causes the clock recovering section 24 to operate while the adjustment amount of the adjusting section 30 is set to an initial state, e.g. while the delay amount of the delay element 40 has an initial value. Next, the calibration section 78 detects the phase difference calculated by the phase comparing section 44 while the phase of the clock signal is stable. For example, the calibration section 78 may detect the phase difference to be a value of the counter 64 shown in FIG. 2 when the phase of the clock signal is stable. The calibration section 78 then calculates the adjustment amount of the adjusting section 30 corresponding to the detected phase difference as the phase difference that causes the phase difference between the clock signal and the adjusted signal in the acquiring section 26 to be the prescribed value.

Instead of the above process, the calibration section 78 may detect the phase difference between the clock signal and the adjusted signal received by the acquiring section 26 while sequentially changing the adjustment amount of the adjusting section 30. In this case, the calibration section 78 detects (i) the adjustment amount for which the detected phase difference becomes a predetermined phase difference as (ii) the adjustment amount that causes the phase difference between the clock signal and the adjusted signal of the acquiring section 26 to be the prescribed value.

The writing section 80 writes the adjustment amount detected by the calibration section 78 to the setting memory 34 in association with the test condition set by the test condition setting section 72. For example, the writing section 80 may overwrite the adjustment amount detected by the calibration section 78 onto an address position corresponding to the set test condition.

Figure 6:
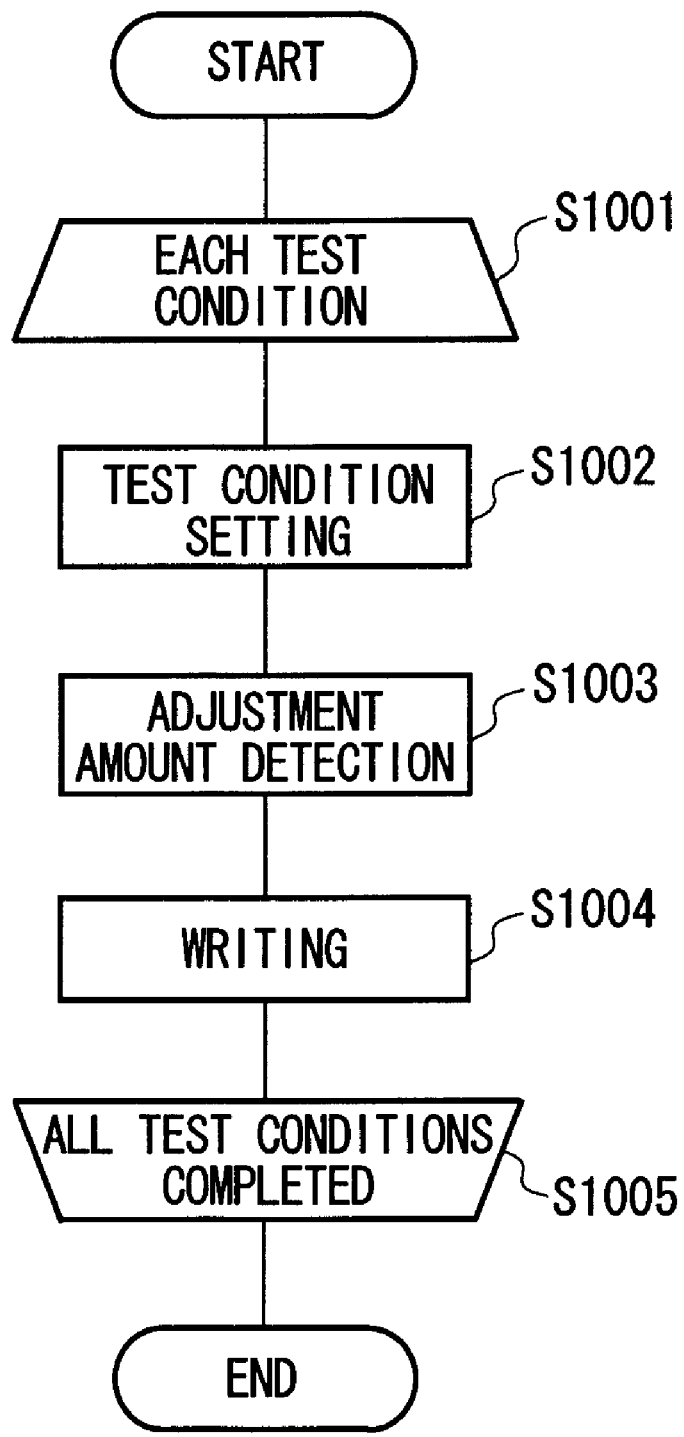
FIG. 6 is a process flow during calibration of the test apparatus 10 according to the first modification.

FIG. 6 is a process flow during calibration of the test apparatus 10 according to the first modification. During calibration, the test condition setting section 72 performs steps S1002 to S1004 for each test condition (S1001, S1005). For example, the test condition setting section 72 may perform steps S1002 to S1004 for each combination of frequency and level of the output signal.

At step S1002, the test condition setting section 72 sets a test condition. For example, the test condition setting section 72 may set a combination of the frequency and the level of the output signal.

At step S1003, the calibration section 78 detects the adjustment amount with reference to the test condition set at step S1002. More specifically, the calibration section 78 causes the adjusted signal generating section 74 to generate an adjusted signal corresponding to the test condition set at step S1002, and supplies this adjusted signal to the clock recovering section 24 and the acquiring section 26. The calibration section 78 detects the adjustment amount that causes the phase difference between the clock signal and the adjusted signal of the acquiring section 26 to be a prescribed value.

At step S1004, the writing section 80 writes the adjustment amount detected at step S1003 to the setting memory 34 in association with the test condition set at step S1002. For example, the writing section 80 may write the adjustment amount detected at step S1003 to the setting memory 34 in association with a combination of the frequency and the level set at step S1002.

When steps S1002 to S1004 have been completed for all of the test conditions that are to be written to the setting memory 34, the calibration is finished (S1005). By performing the process described above, the test apparatus 10 according to the present modification can detect, for each test condition, an adjustment amount that causes the phase difference between the clock signal and the output signal in the acquiring section 26 to be a prescribed value.

The test apparatus 10 may be a test circuit provided on the same electronic device as the circuit under test. This test circuit is realized as a BIST circuit or the like of the electronic device, and performs a diagnostic or the like of the electronic device by testing the circuit under test. In this way, the test circuit can check whether the circuit under test is capable of properly performing the objective necessary for the electronic device.

The test apparatus 10 may be a test circuit that is provided in the same board or apparatus as the circuit under test. This test circuit can check whether the circuit under test is capable of properly performing the intended operations.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

What is claimed is:

1. A test apparatus that tests a device under test, comprising:
   a clock recovering section that recovers a clock signal from an output signal output by the device under test;
   an acquiring section that acquires the output signal at a timing corresponding to the clock signal;
   an adjusting section that adjusts a phase difference between the clock signal and the output signal received by the acquiring section, according to an adjustment amount supplied thereto;
   a setting memory that stores an adjustment amount of the phase difference between the clock signal and the output signal in the acquiring section in association with each of a plurality of test conditions;
   a setting section that supplies the adjusting section with an adjustment amount associated with a test condition for testing the device under test, based on the adjustment amounts stored in the setting memory;
   a test condition setting section that sets a test condition;
   an adjusted signal generating section that generates an adjusted signal corresponding to the test condition set by the test condition setting section; and
   a switching section that receives an output signal of the device under test and the adjusted signal, and outputs either the output signal of the device under test or the adjusted signal, wherein
   the acquiring section acquires a signal based on the output of the switching section.

2. The test apparatus according to claim 1, further comprising a test condition acquiring section that acquires, as the test condition, at least one of a clock frequency and a level of the output signal, wherein
the setting memory stores an adjustment amount in association with each value of the at least one of the level and the frequency of the output signal, and
the setting section supplies the adjusting section with the adjustment amount associated with the test condition acquired by the test condition acquiring section.

3. The test apparatus according to claim 1, wherein
the setting section performs an interpolation based on the adjustment amounts stored in the setting memory to calculate an adjustment amount associated with the test condition for testing the device under test.

4. The test apparatus according to claim 1, further comprising:
a calibration section that supplies the clock recovering section and the acquiring section with the adjusted signal instead of the output signal, and detects an adjustment amount that causes a phase difference between the clock signal and the adjusted signal in the acquiring section to be a prescribed value; and
a writing section that writes, to the setting memory, the adjustment amount detected by the calibration section in association with the test condition set by the test condition setting section.

5. The test apparatus according to claim 1, wherein
the adjusting section includes a delay element that delays the clock signal according to an adjustment amount supplied thereto, and
the clock recovering section includes:
a PLL section that generates the clock signal to have a phase that is shifted by a designated value from a phase of a reference clock of the test apparatus; and
a phase comparing section that detects a phase difference between the output signal and the clock signal delayed by the delay element, and supplies the PLL section with the designated value corresponding to the detected phase difference.

* * * * *